(12) United States Patent
Lee et al.

(10) Patent No.: US 10,325,897 B2
(45) Date of Patent: Jun. 18, 2019

(54) METHOD FOR FABRICATING SUBSTRATE STRUCTURE AND SUBSTRATE STRUCTURE FABRICATED BY USING THE METHOD

(71) Applicant: Samsung Electronics Co., Ltd., Suwon-si, Gyeonggi-do (KR)

(72) Inventors: Ho Jin Lee, Seoul (KR); Seok Ho Kim, Hwaseong-si (KR); Kwang Jin Moon, Hwaseong-si (KR); Byung Lyul Park, Seoul (KR); Nae In Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/705,427

(22) Filed: Sep. 15, 2017

(65) Prior Publication Data

US 2018/0138164 A1    May 17, 2018

(30) Foreign Application Priority Data

Nov. 14, 2016 (KR) .......................... 10-2016-0150805

(51) Int. Cl.
*H01L 21/768* (2006.01)
*H01L 23/00* (2006.01)
(Continued)

(52) U.S. Cl.
CPC .......... *H01L 25/50* (2013.01); *H01L 21/3065* (2013.01); *H01L 21/3083* (2013.01);
(Continued)

(58) Field of Classification Search
CPC ......... H01L 25/50; H01L 24/81; H01L 24/73; H01L 24/16; H01L 21/3065;
(Continued)

(56) References Cited

U.S. PATENT DOCUMENTS

| 7,129,172 B2 | 10/2006 | Morrow et al. |
| 7,195,988 B2 | 3/2007 | Nemoto et al. |

(Continued)

FOREIGN PATENT DOCUMENTS

| EP | 3038148 A1 | 6/2016 |
| JP | 2005/026413 A | 1/2005 |

(Continued)

*Primary Examiner* — Caridad Everhart
(74) *Attorney, Agent, or Firm* — Harness, Dickey & Pierce, P.L.C.

(57) ABSTRACT

There is provided a method for fabricating a substrate structure capable of enhancing process reproducibility and process stability by trimming a bevel region of a substrate using a wafer level process. The method includes providing a first substrate including first and second surfaces opposite each other and a first device region formed at the first surface, providing a second substrate including third and fourth surfaces opposite each other and a second device region at the third surface, bonding the first substrate and the second substrate to electrically connect the first device region and the second device region, and forming a trimmed substrate. The forming the trimmed substrate includes etching an edge region of the second substrate bonded to the first substrate.

20 Claims, 15 Drawing Sheets

(51) Int. Cl.
*H01L 25/00* (2006.01)
*H01L 25/065* (2006.01)
*H01L 21/3065* (2006.01)
*H01L 21/308* (2006.01)
*H01L 21/67* (2006.01)

(52) U.S. Cl.
CPC ......... *H01L 21/67* (2013.01); *H01L 21/76898* (2013.01); *H01L 24/08* (2013.01); *H01L 24/16* (2013.01); *H01L 24/32* (2013.01); *H01L 24/73* (2013.01); *H01L 24/81* (2013.01); *H01L 24/83* (2013.01); *H01L 24/89* (2013.01); *H01L 24/92* (2013.01); *H01L 25/0657* (2013.01); H01L 21/308 (2013.01); H01L 2224/08145 (2013.01); H01L 2224/16145 (2013.01); H01L 2224/16146 (2013.01); H01L 2224/32145 (2013.01); H01L 2224/73204 (2013.01); H01L 2224/80895 (2013.01); H01L 2224/80896 (2013.01); H01L 2224/81895 (2013.01); H01L 2224/81896 (2013.01); H01L 2224/92125 (2013.01); H01L 2225/06513 (2013.01); H01L 2225/06541 (2013.01); H01L 2225/06568 (2013.01)

(58) Field of Classification Search
CPC ......... H01L 21/308; H01L 2224/80895; H01L 25/0657; H01L 21/3081; H01L 21/76838; H01L 34/16; H01L 34/32; H01L 34/81; H01L 2224/80896
See application file for complete search history.

(56) References Cited

U.S. PATENT DOCUMENTS

| | | | |
|---|---|---|---|
| 7,709,932 | B2 | 5/2010 | Nemoto et al. |
| 8,173,518 | B2 | 5/2012 | Liu et al. |
| 8,343,851 | B2 | 1/2013 | Kim et al. |
| 8,466,040 | B2 | 6/2013 | Park |
| 9,064,770 | B2 | 6/2015 | Kuo et al. |
| 9,070,729 | B2 | 6/2015 | Ji et al. |
| 9,087,873 | B2 | 7/2015 | Owada |
| 9,461,007 | B2 | 10/2016 | Chun et al. |
| 2012/0094469 | A1* | 4/2012 | Landru ............ H01L 24/03 438/455 |
| 2012/0122299 | A1* | 5/2012 | Wang ............ H01L 21/76256 438/458 |
| 2014/0113452 | A1 | 4/2014 | Lin et al. |
| 2015/0004738 | A1* | 1/2015 | Fujii ............ H01L 27/14634 438/64 |
| 2016/0189998 | A1 | 6/2016 | Yasuda et al. |

FOREIGN PATENT DOCUMENTS

| | | |
|---|---|---|
| KR | 2015/0037146 A | 4/2015 |
| KR | 101548173 B1 | 8/2015 |
| KR | 2016/0007240 A | 1/2016 |
| KR | 101620589 B1 | 5/2016 |
| KR | 2016/0078291 A | 7/2016 |

* cited by examiner

METHOD FOR FABRICATING SUBSTRATE STRUCTURE AND SUBSTRATE STRUCTURE FABRICATED BY USING THE METHOD

CROSS-REFERENCE TO RELATED APPLICATION

This application claims priority under 35 U.S.C. § 119 to Korean Patent Application No. 10-2016-0150805 filed on Nov. 14, 2016 in the Korean Intellectual Property Office, the entire contents of which are herein incorporated by reference.

BACKGROUND

1. Technical Field

The present disclosure relates to a method for fabricating a substrate structure and/or a substrate structure fabricated using the same and, more specifically, to a method for trimming an edge of a substrate and/or a substrate structure fabricated using the same.

2. Description of Related Art

Many wafers may include a bevel edge caused by a wafer thinning process. When a mechanical stress and/or a thermal stress generated by a semiconductor device fabricating process are applied to a wafer, the bevel may cause non-uniform stress to be added to the edge of the wafer. As a result, crack and delamination of wafer can occur.

Therefore, removing the bevel edge through the wafer edge trimming process may be beneficial.

SUMMARY

Inventive concepts relate to a method for fabricating a substrate structure capable of enhancing process reproducibility and process stability by trimming a bevel region of a substrate using a wafer level process.

Inventive concepts also relate to a substrate structure fabricated by trimming a bevel region of a substrate using a wafer level process.

Features and effects of inventive concepts are not limited to those described above and other features and effects of inventive concepts will be clearly understood by persons of ordinary skill in the art from the following description.

According to some example embodiments of inventive concepts, a method for fabricating a substrate structure includes providing a first substrate including first and second surfaces opposite each other and a first device region at the first surface, providing a second substrate including third and fourth surfaces opposite each other and a second device region at the third surface, bonding the first substrate and the second substrate to electrically connect the first device region and the second device region, and forming a trimmed substrate. The forming the trimmed substrate includes etching an edge region of the second substrate bonded to the first substrate.

According to some example embodiments of inventive concepts, a method for fabricating a substrate structure includes providing a first substrate including first and second surfaces opposite each other and a first device region at the first surface, bonding the first surface of the first substrate to a carrier, removing a portion of the first substrate bonded to the carrier to reduce a thickness of the first substrate, and removing an edge region of the first substrate using a dry etching process when the second surface of the first substrate having the reduced thickness is entirely exposed.

According to some example embodiments of inventive concepts, a method for fabricating a substrate structure includes providing a first substrate including a first device region at a first surface of the first substrate; providing a second substrate including a second device region formed at a second surface of the second substrate; directly bonding the first surface of the first substrate and the second surface of the second substrate such that the first device region and the second device region face each other; removing a portion of the second substrate bonded to the first substrate to reduce a thickness of the second substrate; and forming a first trimmed substrate. The forming the first trimmed substrate includes dry etching an edge region of the second substrate having the reduced thickness to form a first trimmed substrate.

According to some example embodiments of inventive concepts, a substrate structure includes a first substrate including first and second surfaces opposite each other and a first device region at the first surface; and a second substrate including third and fourth surfaces opposite each other and a second device region at the third surface. A size of the second substrate is less than a size of the first substrate. The third surface of the second substrate is directly bonded to the first surface of the first substrate. The first device region and the second device region are electrically connected to each other.

According to some example embodiments of inventive concepts, a method of fabricating a substrate structure includes forming a preliminary substrate structure and forming a trimmed substrate. The forming the trimmed substrate includes etching an edge region of the preliminary substrate structure. The preliminary substrate structure includes a first device region of a first substrate bonded to a second device region of a second substrate such that a first surface of the second device region is on top of a first surface of the first device region. The first substrate includes the first device region on one surface of a first base substrate. The etching the edge region of the preliminary substrate structure makes a sidewall of the first device region and a sidewall of the second device region define an inclined surface with respect to the one surface of the first base substrate. The edge region of the preliminary substrate structure includes an edge region of the first device region and an edge region of the second device region.

BRIEF DESCRIPTION OF THE DRAWINGS

The above and other features and effects of inventive concepts will become more apparent to those of ordinary skill in the art by describing non-limiting embodiments with reference to the accompanying drawings, in which.

DETAILED DESCRIPTION

FIGS. 1 to 10 are views illustrating intermediate stages of fabrication, provided to explain a method for fabricating a substrate structure according to some example embodiments of inventive concepts.

Figure 1:
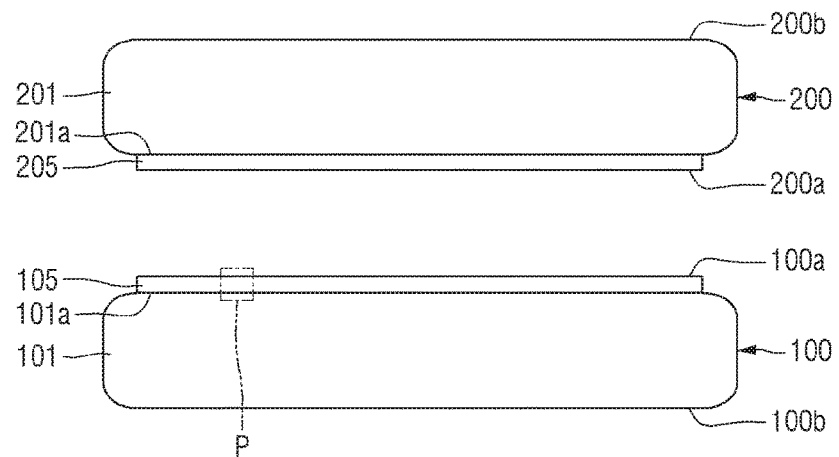
FIGS. 1 to 10 are views illustrating intermediate stages of fabrication, provided to explain a method for fabricating a substrate structure according to some example embodiments of inventive concepts.
Figure 2:
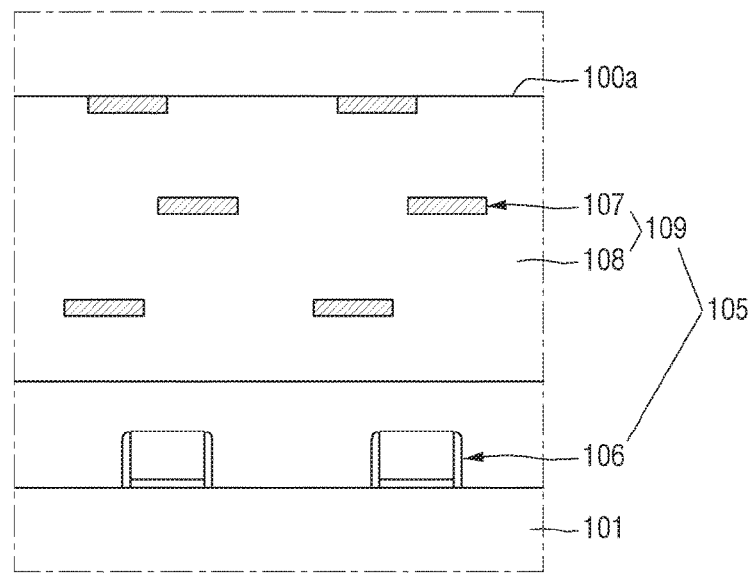
Figure 3:
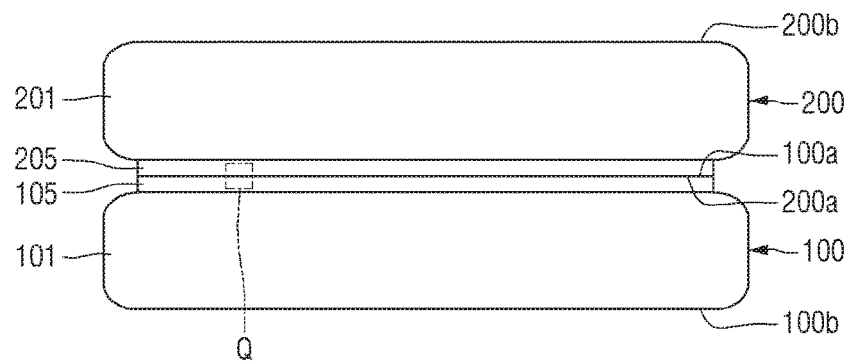
Figure 4:
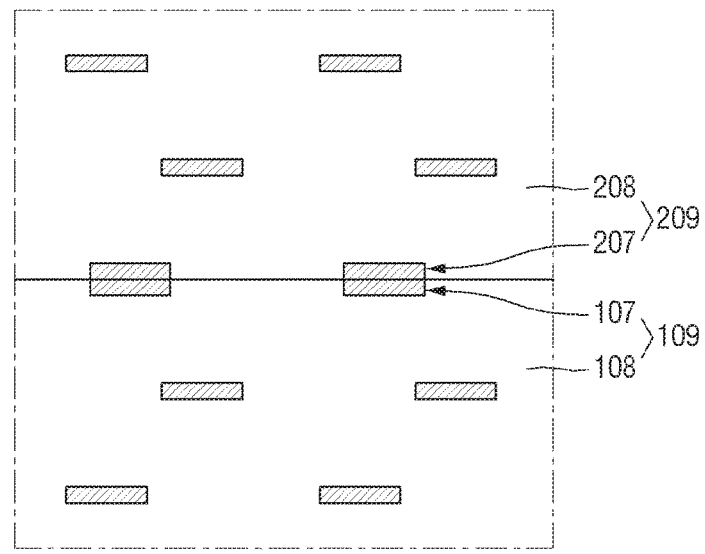
Figure 5:
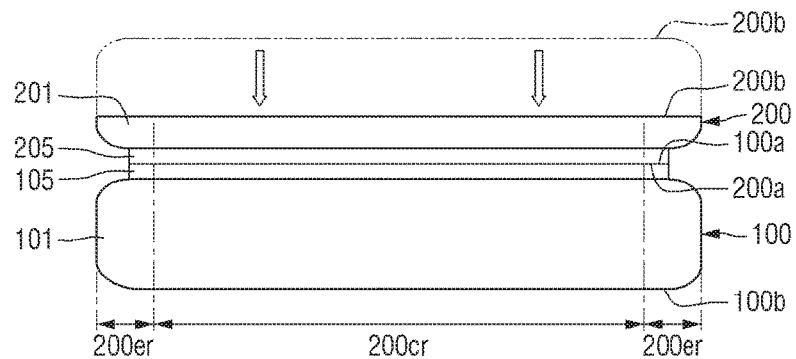
Figure 8:
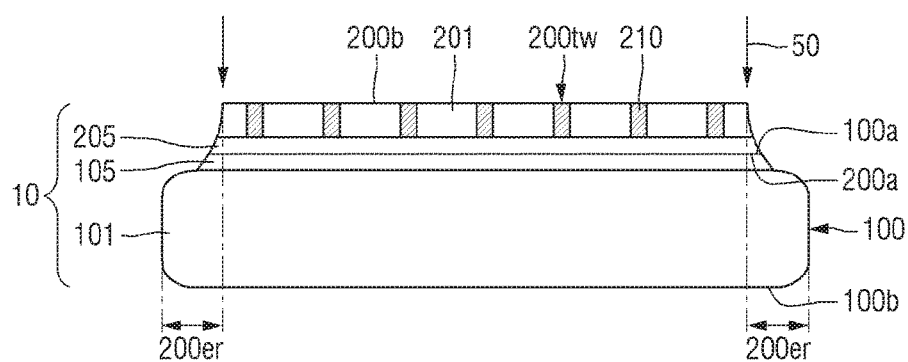

For reference, FIG. 2 is an enlargement view of an encircled section P of FIG. 1. FIG. 4 is an enlargement view of an encircled section Q of FIG. 3, FIG. 5 is a cross sectional view taken on line A-A of FIG. 6. FIG. 8 is a cross sectional view taken on line A-A of FIG. 9. In other words, FIGS. 6 and 9 may be top views of a second substrate of FIGS. 5 and 8 as viewed from above. FIG. 10 is a schematic view provided to explain a first dry etch process of FIG. 8.

Referring to FIG. 1, a first substrate 100 including a first device region 105, and a second substrate 200 including a second device region 205 are provided.

The first substrate 100 may include a first surface 100a and a second surface 100b opposite each other. The first substrate 100 includes a first base substrate 101 and the first device region 105 formed on the first base substrate 101.

The first device region 105 may be formed at the first surface 100a of the first substrate. That is, the first surface 100a of the first substrate may be defined by the first device region 105.

The first device region 105 may be formed on one surface 101a of the first base substrate. The other surface of the first base substrate 101 opposite the first surface 101a of the first base substrate may be the second surface 100b of the first substrate.

The second substrate 200 may include a first surface 200a and a second surface 200b opposite each other. The second substrate 200 includes a second base substrate 201 and the second device region 205 formed on the second base substrate 201.

The second device region 205 may be formed at the first surface 200a of the second substrate. That is, the first surface 200a of the second substrate may be defined by the second device region 205.

The second device region 205 may be formed on the first surface 201a of the second base substrate. The other surface of the second base substrate 201 opposite the first surface 201a of the second base substrate may be the second surface 200b of the second substrate.

Each of the first substrate 100 and/or the second substrate 200 may include a plurality of die regions that may become logic chips and/or memory chips through a dicing process.

When the first substrate 100 and/or the second substrate 200 includes regions intended to be logic chips, the first device region 105 included in the first substrate 100 and/or the second device region 205 included in the second substrate 200 may be variously designed by considering the calculation performed, and so on.

When the first substrate 100 and/or the second substrate 200 includes die regions intended to be memory chips, the first device region 105 included in the first substrate 100 and/or the second device region 205 included in the second substrate 200 may include a device pattern for a non-volatile memory or a volatile memory.

Specifically, when the memory chip is a volatile memory chip, the memory chip may include a dynamic random-access memory (DRAM). When the memory chip is a non-volatile memory chip, the memory chip may be a flash memory chip. More specifically, the memory chip may be any of NAND flash memory chip or NOR flash memory chip.

Meanwhile, the memory device according to the spirit of the present disclosure is not limited to the specific configuration exemplified above. According to some example embodiments, the flash memory chip may include any of a phase-change random-access memory (PRAM), a magneto-resistive random-access memory (MRAM), or a resistive random-access memory (RRAM).

The first base substrate 101 and the second base substrate 201 may each be a bulk silicon or a silicon-on-insulator (SOI). Alternatively, the first base substrate 101 and the second base substrate 201 may each be a silicon substrate, or may include other material such as silicon germanium, silicon germanium on insulator (SGOI), indium antimonide, lead telluride, indium arsenide, indium phosphide, gallium arsenide, or gallium antimonide, but example embodiments are not limited thereto.

The first device region 105 may include a circuit pattern 106 and a wiring structure 109. Although it is illustrated that the circuit pattern 106 is formed on the first base substrate 101, example embodiments are not limited thereto. The circuit pattern 106 may be formed within the first base substrate 101.

The wiring structure 109 may be formed on the circuit pattern 106. The wiring structure 109 includes a first interlayer insulating film 108 and a first wiring 107 formed within the first interlayer insulating film 108. The first wiring 107 is electrically connected to the circuit pattern 106.

Although not illustrated, the second device region 205 may also include a circuit pattern and a wiring structure.

Then, the first substrate 100 and the second substrate 200 are disposed so that the first surface 100a of the first substrate and the first surface 200a of the second substrate face each other.

In other words, the first substrate 100 and the second substrate 200 are disposed so that the first device region 105 formed at the first surface 100a of the first substrate and the second device region 205 formed at the first surface 200a of the second substrate face each other.

While FIG. 1 illustrates that the first device region 105 is not formed in a bevel portion of the first base substrate 101, and the second device region 205 is not formed in a bevel portion of the second base substrate 201, this is provided only for convenience of explanation and example embodiments are not limited thereto.

Referring to FIGS. 3 and 4, the first substrate 100 and the second substrate 200 are bonded. The second substrate 200 is bonded to the first substrate 100.

More specifically, the first surface 100a of the first substrate 100 and the first surface 200a of the second substrate, which are disposed so as to face each other, may be bonded so that the first substrate 100 and the second substrate 200 are bonded. The first surface 200a of the second substrate may be bonded to the first surface 100a of the first substrate.

In the method for fabricating the substrate structure according to some example embodiments of inventive concepts, the first substrate 100 and the second substrate 200 may be directly bonded. Herein, the expression "directly bond" means that the first substrate 100 and the second substrate 200 are directly connected without having an adhesive layer or a connector that may be formed on the first substrate 100 and/or the second substrate 200.

The bonding between the first substrate 100 and the second substrate 200 may cause the first device region 105 formed at the first surface 100a of the first substrate and the second device region 205 formed at the first surface 200a of the second substrate to be bonded. The first surface 100a of the first substrate and the first surface 200a of the second substrate may be directly bonded so that the first device region 105 and the second device region 205 face each other.

The direct bonding between the first substrate 100 and the second substrate 200 may cause the first device region 105 and the second device region 205 to be directly bonded.

In FIG. 4, the bonding between the first substrate 100 and the second substrate 200 causes the first device region 105 and the second device region 205 to be electrically connected. The directly-bonded, first device region 105 and second device regions 205 are electrically connected.

For example, the first device region 105 and the second device region 205 may be electrically connected as the first wiring 107 included in the first device region 105 and a second wiring 207 included in the second device region 205 are connected to each other.

The first device region 105 and the second device region 205 may be directly bonded as the first interlayer insulating film 108 included in the first device region 105 is in direct contact with the second interlayer insulating film 208 included in the second device region 205.

As illustrated in FIG. 4, the first wiring 107 included in the first device region 105 and the second wiring 207 included in the second device region 205 are formed in a single layer, but example embodiments are not limited thereto.

Further, although the uppermost layer of the first wiring 107 and the uppermost layer of the second wiring 207 that are connected each other are directly bonded, example embodiments are not limited thereto. A thin conductive liner film that can aid in bonding of the first wiring 107 and the second wiring 207 may be disposed between the first wiring 107 and the second wiring 207 that are bonded to each other. However, the conductive liner film may be of such a thickness as not to hinder direct bonding of the first surface 100a of the first substrate and the second surface 200b of the second substrate.

In the method for fabricating the substrate structure according to some example embodiments of inventive concepts, the first substrate 100 may serve as a carrier substrate for edge trimming of the second substrate 200.

Figure 6:
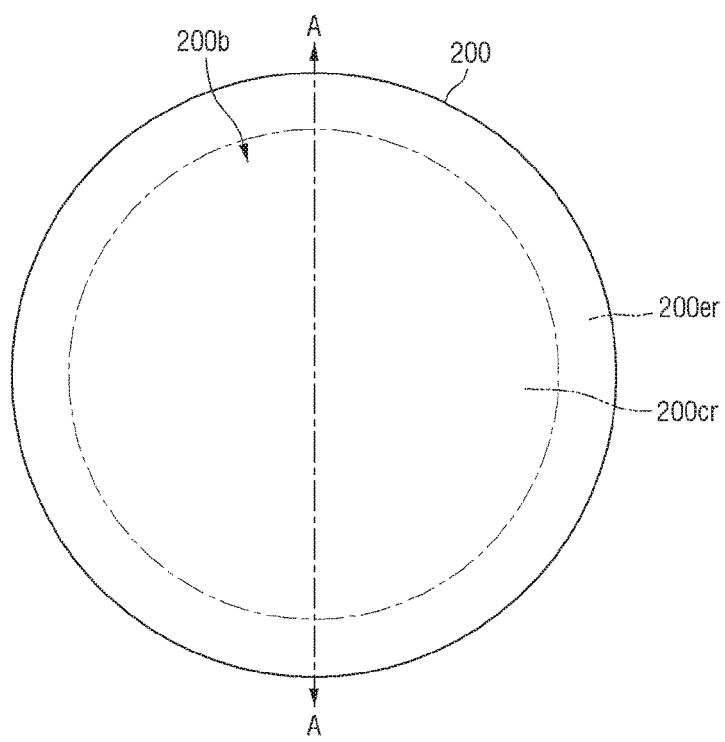

Referring to FIGS. 5 and 6, a portion of the second substrate 200 bonded to the first substrate 100 may be removed to reduce a thickness of the second substrate 200.

By removing a portion of the second base substrate 201, the thickness of the second substrate 200 may be reduced. The second surface 200b of the second substrate becomes closer to the second device region 205 as the thickness of the second substrate 200 is reduced.

The second substrate 200 having the reduced thickness includes a center region 200cr and an edge region 200er defined along a perimeter of the center region 200cr. That s, the edge region 200er of the second substrate having the reduced thickness may be the edge portion of the second substrate 200.

The edge region 200er of the second substrate includes a portion where the thickness of the second substrate 200 decreases as the distance from the center of the second substrate 200 increases. In other words, the edge region 200er of the second substrate may include a bevel region of the second substrate 200.

Figure 7:
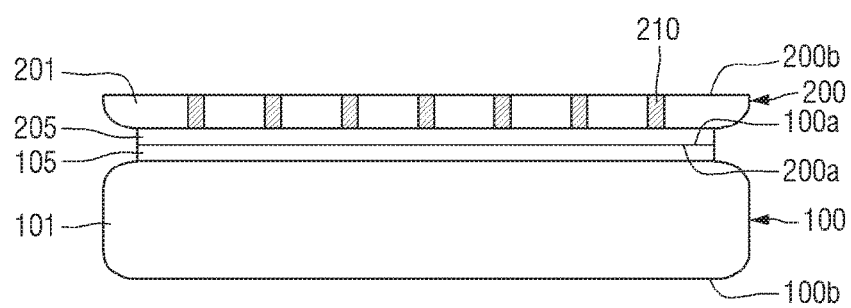

Referring to FIG. 7, a first through electrode 210 may be formed in the second substrate 200 such that the first through electrode 210 is electrically connected to the second device region 205.

For example, the first through electrode 210 may extend from the second surface 200b of the second substrate to the second device region 205. After a via hole penetrating the second base substrate 201 is formed, the first through electrode 210 may be formed by filling the via hole with a conductive material.

The first through electrode 210 may be electrically connected to the first device region 105 through the second device region 205.

The first through electrode 210 may include, for example, copper (Cu), aluminum (Al), or tungsten (W). A liner and a barrier film may be additionally included between the first through electrode 210 and a semiconductor material which is the second base substrate 201. The barrier film may include, for example, Ta, TaN, Ti, TiN, Ru, Co, Ni, NiB, WN, and so on. The liner may include, for example, silicon oxide having a low dielectric constant, or silicon oxide doped with carbon, and so on.

Unlike described above, after a first trimmed substrate 200tw (in FIG. 8) is formed by removing the edge region 200er of the second substrate, the first through electrode 210 may be formed in the first trimmed substrate 200tw.

Figure 9:
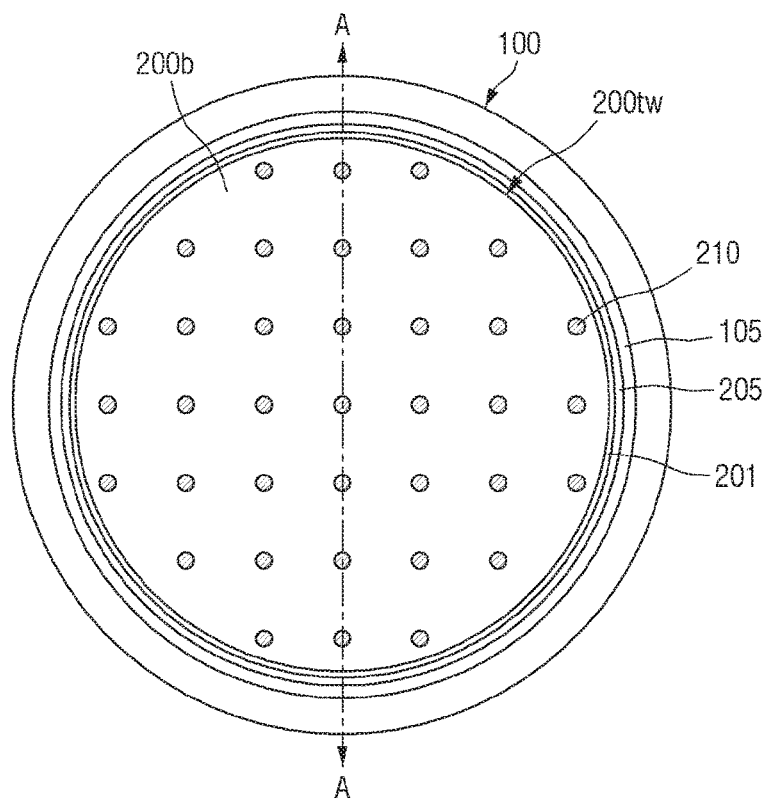
Figure 10:
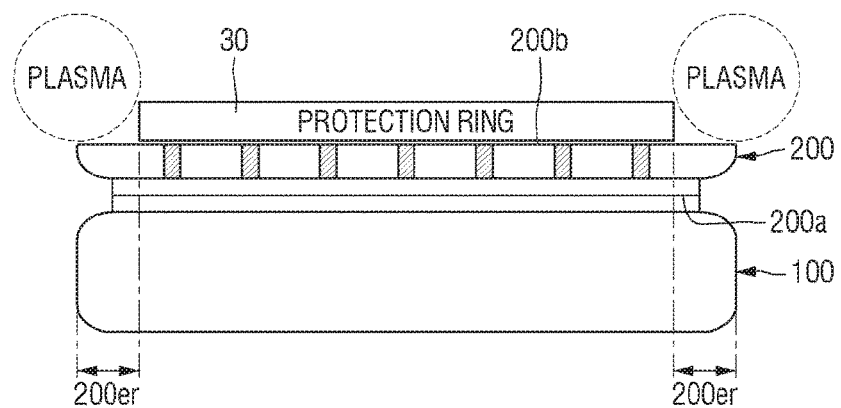

Referring to FIGS. 8 to 10, the first trimmed substrate 200tw bonded to the first substrate 100 may be formed by etching the edge region 200er of the second substrate 200 bonded to the first substrate 100. As a result, a first substrate structure 10, to which the first substrate 100 and the first trimmed substrate 200tw are bonded, is formed.

The first trimmed substrate 200tw may be an edge-trimmed substrate from which edge portions of the second substrate 200 are removed. Alternatively, the first trimmed substrate 200tw may be formed by removing the bevel region of the second substrate 200 having the reduced thickness.

In the method of fabricating a substrate structure according to some example embodiments of inventive concepts, the edge region 200er of the second substrate may be removed through a dry etch process. For example, the edge region 200er of the second substrate may be removed through a first etch process 50.

The first etch process 50 may be performed in state in which the second surface 200b of the second substrate having the reduced thickness is entirely exposed. That is, the first etch process 50 may be performed without forming a mask pattern for removing the edge region 200er of the second substrate on the second surface 200b of the second substrate.

In a state where the second surface 200b of the second substrate is entirely exposed, the edge region 200er of the second substrate may be removed using the first etch process 50. As a result, the first trimmed substrate 200tw may be formed.

The size of the first trimmed substrate 200tw is less than that of the second substrate 200 as the edge region 200er of the second substrate is removed. That is, a diameter of the first trimmed substrate 200tw is less than that of the second substrate 200.

In addition, during the first etch process 50, not only the edge region 200er of the second substrate, but also a portion of the first device region 105 and a portion of the first base substrate 101 may be etched. That is, a recess may be formed on one surface of the first base substrate 101.

Furthermore, because the edge region 200er of the second substrate is removed through the first etch process 50 which is a dry etch process, a sidewall of the first trimmed substrate 200tw may include an inclined surface having a slope that is an acute angle with respect to the first surface 100a of the first substrate. The sidewall of the first trimmed substrate 200tw may have a continuous profile with a sidewall of the first device region 105.

The first etch process 50 will be described with reference to FIG. 10.

The bonded first substrate 100 and second substrate 200 may be loaded into an etching equipment. After loading, a protection ring 30 may be located on the second surface 200b of the second substrate. The protection ring 30 may limit (and/or prevent) the plasma generated in the equipment from flowing into the lower portion of the protection ring 30.

A plasma may be generated in a state in which the protection ring 30 is disposed on the second surface 200b of the second substrate. By the generated plasma, the edge region 200er of the second substrate may be etched.

Because the protection ring 30 is disposed on the second surface 200b of the second substrate, even if the dry etching proceeds while the second surface 200b of the second substrate is entirely exposed, only the edge region 200er of the second substrate may be removed.

The effect obtained by removing the bevel edge of the second substrate 200 through the etch process instead of the mechanical trimming is as follows.

First, because the etch process may be performed using the etching equipment in the fab, the process reproducibility of the process for forming the first trimmed substrate 200tw can be improved. In addition, since a cutting tool used for mechanical trimming is not used, the process cost can be lowered.

Since mechanical stress and thermal stress caused by mechanical trimming are not applied to the second substrate 200 and the first substrate 100, separation of the second substrate 200 from the first substrate 100, or delamination of the second base substrate 201 from the second device region 205 can be limited and/or prevented. In addition, mechanical stress and thermal stress caused by mechanical trimming are not applied to the second substrate 200 and the first substrate 100, so that it is possible to limit (and/or prevent) the second substrate 200 having the reduced thickness from being chipped or broken.

Further, the number of particles generated by mechanical trimming can be reduced, so that it may be possible to reduce or prevent contamination of the first substrate structure 10.

In addition, although mechanical trimming proceeds in a low cleanliness region, the dry etch process proceeds in a fab with high cleanliness, so that contamination of the first substrate structure 10 can be alleviated or prevented.

Additionally, after the first substrate 100 including the first device region 105 and the second substrate 200 including the second device region 205 are bonded, the bevel edge of the second substrate 200 may be removed. That is, when the first substrate structure 10 is divided into a plurality of chip dies through the dicing process, a plurality of stacked semiconductor chip dies may be formed without a separate laminating process.

The first substrate structure 10 will be described with reference to FIGS. 8 and 9.

The first substrate structure 10 may include the first substrate 100 and the first trimmed substrate 200tw. The first substrate 100 includes the first surface 100a and the second surface 100b opposite each other, and the first device region 105 formed at the first surface 100a of the first substrate. The first trimmed substrate 200tw includes the first surface 200a and the second surface 200b opposite each other, and the second device region 205 formed at the first surface 200a of the first trimmed substrate 200tw. The size of the first trimmed substrate 200tw is less than that of the first substrate 100.

The first surface 200a of the first trimmed substrate 200tw and the first surface 100a of the first substrate are directly bonded. Further, the first device region 105 may be electrically connected to the second device region 205.

The sidewall of the first trimmed substrate 200tw includes an inclined surface having a slope that is acute with respect to the first surface 100a of the first substrate.

Figure 11:
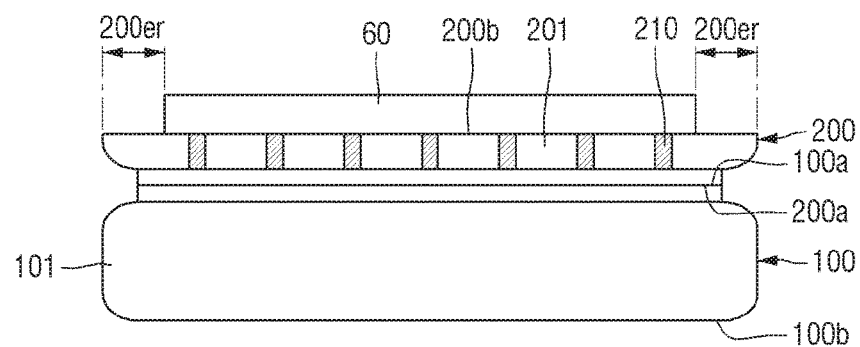
FIGS. 11 and 12 are views illustrating intermediate stages of fabrication, provided to explain a method for fabricating a substrate structure according to some example embodiments of inventive concepts.
Figure 12:
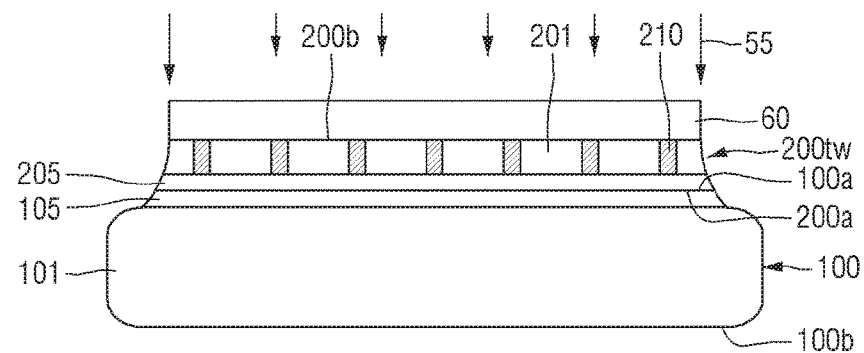

FIGS. 11 and 12 are views illustrating intermediate stages of fabrication, provided to explain a method for fabricating a substrate structure according to some example embodiments of inventive concepts. For convenience of explanation, differences that are not explained above with reference to FIGS. 1 to 10 will be mainly explained below.

For reference, FIG. 11 may involve a process performed after FIG. 7.

Referring to FIG. 11, a mask pattern 60 may be formed on the second substrate 200. The mask pattern 60 may be formed on the second surface 200b of the second substrate.

The mask pattern 60 may expose the edge region 200er of the second substrate. That is, the mask pattern 60 is not formed on the second surface 200b of the second substrate included in the edge region 200er of the second substrate.

The mask pattern 60 may be formed in a central region of the second substrate 200, and may expose an edge portion including the bevel of the second substrate 200.

Referring to FIG. 12, the edge region 200er of the second substrate may be removed using the mask pattern 60.

The edge region 200er of the second substrate may be etched through second etch process 55 to form the first trimmed substrate 200tw bonded to the first substrate 100. For example, the second etch process 55 may be a dry etch process.

An etch gas of the second etch process 55 may be provided entirely on the second surface 200b of the second substrate. However, because the mask pattern 60 is formed on the second surface 200b of the second substrate, the edge region 200er of the second substrate is removed, and the remaining region of the second substrate 200 is not etched.

Next, by removing the mask pattern 60, the first substrate structure 10, to which the first substrate 100 and the first trimmed substrate 200tw are bonded, is formed.

Figure 13:
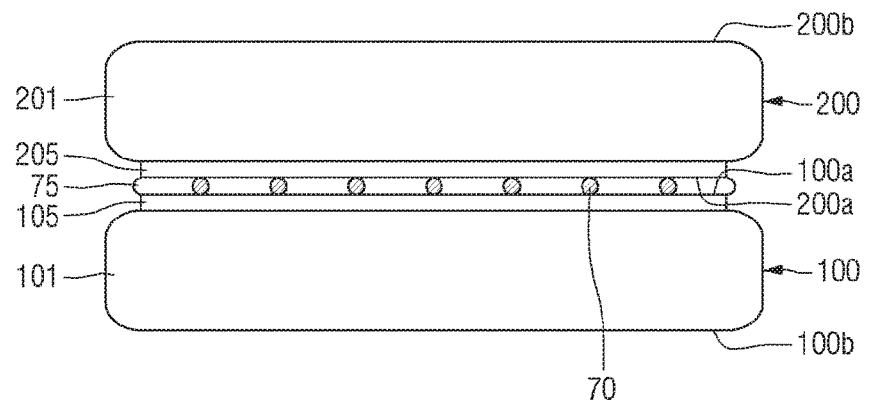
FIG. 13 is a view illustrating intermediate stages of fabrication, provided to explain a method for fabricating a substrate structure according to some example embodiments of inventive concepts.

FIG. 13 is a view illustrating intermediate stages of fabrication, provided to explain a method for fabricating a substrate structure according to some example embodiments of inventive concepts. For convenience of explanation, differences that are not explained above with reference to FIGS. 1 to 10 will be mainly explained below.

For reference, FIG. 13 may involve a process performed after FIG. 1.

Referring to FIG. 13, a conductive connector 70 by which the first device region 105 and the second device region 205 are electrically connected may be formed between the first device region 105 of the first substrate 100 and the second device region 205 of the second substrate 200.

In the method for fabricating a substrate structure according to some example embodiments of inventive concepts, the first device region 105 and the second device region 205 may be electrically connected to each other through the conductive connector 70.

That is, the first wiring 107 (in FIG. 4) of the first device region 105 and the second wiring 207 (in FIG. 4) of the second device region 205 may be electrically connected by the conductive connector 70. In other words, the first device region 105 and the second device region 205 are not directly electrically connected, but may be electrically connected indirectly through the conductive connector 70.

Because the conductive connector 70 is interposed between the first device region 105 and the second device region 205, the first device region 105 and the second device region 205 are not directly bonded. In addition, the first surface 100a of the first substrate and the first surface 200a of the second substrate may be bonded by the conductive connector 70, rather than being directly bonded.

An encapsulating insulating film 75 surrounding the periphery of the conductive connector 70 may be formed between the first surface 100a, of the first substrate and the first surface 200a of the second substrate. The encapsulating insulating film 75 may not only surround the conductive connector 70 but also bond the first surface 100a of the first substrate and the first surface 200a of the second substrate.

As illustrated in FIG. 13, the conductive connector 70 may have a ball-like shape, but not limited thereto. That is, the conductive connector 70 may have a pillar shape, and may have a combined shape of a pillar-shape of a first conductor and a ball-like shape of a second conductor.

Then, a process of reducing the thickness of the second substrate 200 may be performed. For example, the thickness of the second substrate 200 may be reduced using the same process described with reference to FIG. 5. Then, although not illustrated, the edge region (see 200er of FIG. 8) of the second substrate 200 may be removed using a process that is the same as the first etch process 50 described with reference to FIG. 10 or the second etch process 55 described with reference to FIG. 12, except an edge portion of the encapsulating insulating film 75 may be removed as well.

Figure 14:
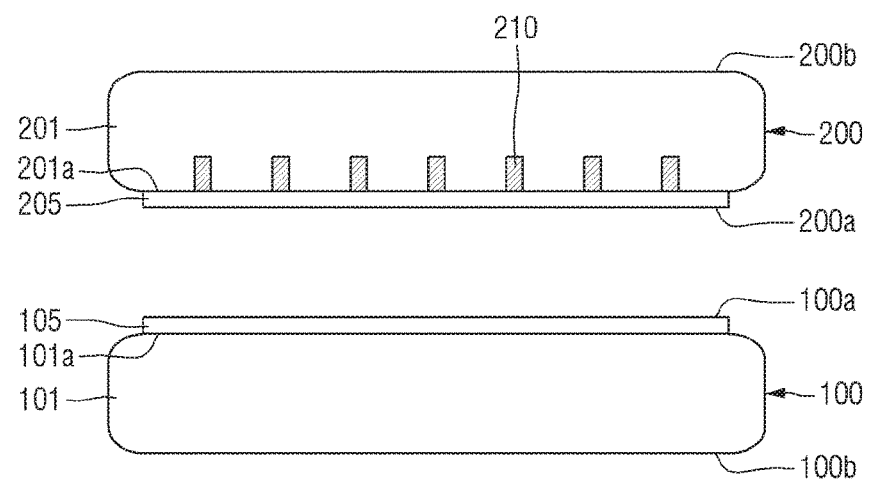
FIGS. 14 and 15 are views illustrating intermediate stages of fabrication, provided to explain a method for fabricating a substrate structure according to some example embodiments of inventive concepts.
Figure 15:
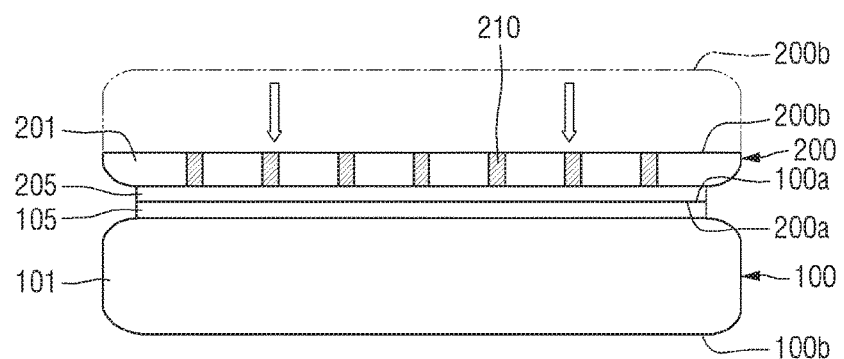

FIGS. 14 and 15 are views illustrating intermediate stages of fabrication, provided to explain a method for fabricating a substrate structure according to some example embodiments of inventive concepts. For convenience of explanation, differences that are not explained above with reference to FIGS. 1 to 10 will be mainly explained below.

Referring to FIG. 14, the second substrate 200 including the first through electrode 210 is provided, wherein the first through electrode 210 is electrically connected to the second device region 205.

The second substrate 200 before being bonded to the first substrate 100 may include the first through electrode 210 formed in the second substrate 200.

In FIG. 14, the first through electrode 210 is illustrated as not being passed through the second device region 205, although example embodiments are not limited thereto.

That is, the shape in which the first through electrode 210 extends may vary depending on whether the first through electrode 210 is formed before the front end of line (FEOL) process, or between the FEOL process and back end of line (BEOL) process, or during the BEOL process or after.

Next, the first substrate 100 and the second substrate 200 are bonded to each other.

Referring to FIG. 15, a portion of the second substrate 200 bonded to the first substrate 100 may be removed to reduce the thickness of the second substrate 200. While reducing the thickness of the second substrate 200, the first through electrode 210 formed in the second substrate 200 may be exposed.

That is, a portion of the second base substrate 201 may be removed to expose the first through electrode 210.

Figure 16:
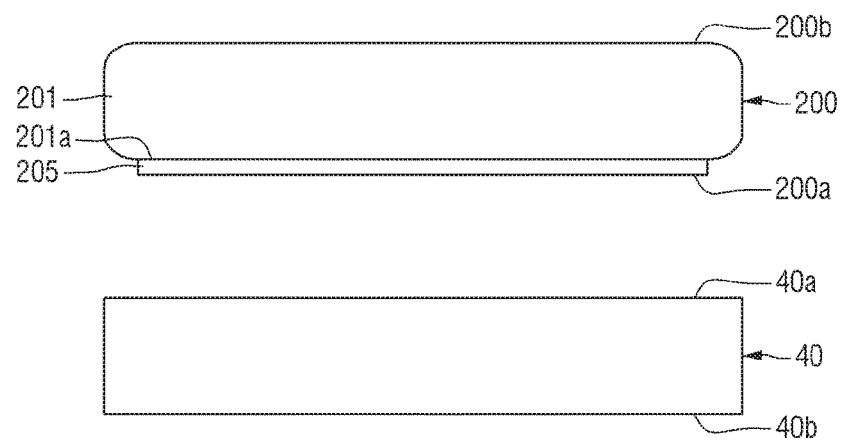
FIGS. 16 and 17 are views illustrating intermediate stages of fabrication, provided to explain a method for fabricating a substrate structure according to some example embodiments of inventive concepts.
Figure 17:
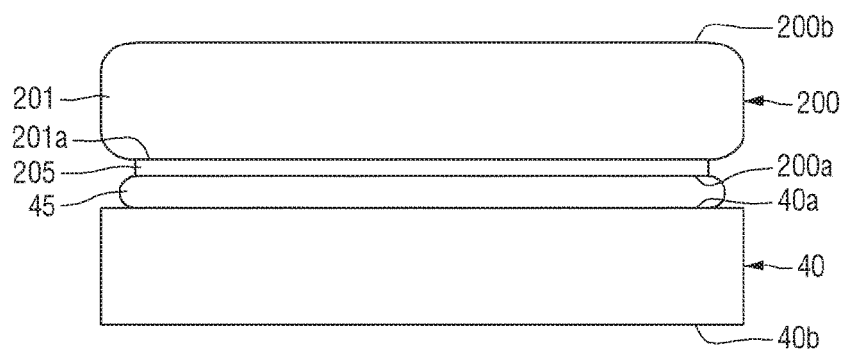

FIGS. 16 and 17 are views illustrating intermediate stages of fabrication, provided to explain a method for fabricating a substrate structure according to some example embodiments of inventive concepts. For convenience of explanation, differences that are not explained above with reference to FIGS. 1 to 10 will be mainly explained below.

Referring to FIG. 16, the second substrate 200 including a carrier 40 and the second device region 205 is provided.

The carrier 40 includes a first surface 40a and a second surface 40b opposite each other. For example, the carrier 40 may not include a device region.

That is, the carrier 40 may be a bare wafer on which no circuit pattern is formed, or may be a supporter capable of limiting and/or preventing deformation of the substrate 200 that may occur while the bevel region of the second substrate 200 is being trimmed.

Referring to FIG. 17, the second substrate 200 and the carrier 40 may be bonded using an adhesive film 45.

The adhesive film 45 may be disposed between the first surface 40a of the carrier and the first surface 200a of the second substrate. The adhesive film 45 may serve to fix the carrier 40 and the second substrate 200 to each other.

Then, the thickness of the second substrate 200 may be reduced. In addition, the bevel region of the second substrate 200 having the reduced thickness may be removed by the first etch process 50 (in FIG. 8). As a result, the first trimmed substrate 200tw (in FIG. 8) bonded to the carrier 40 may be formed.

FIGS. 18 to 22B are views illustrating intermediate stages of fabrication, provided to explain a method for fabricating a substrate structure according to some example embodiments of inventive concepts. For reference, FIG. 18 may be a process performed after FIG. 8.

Figure 18:
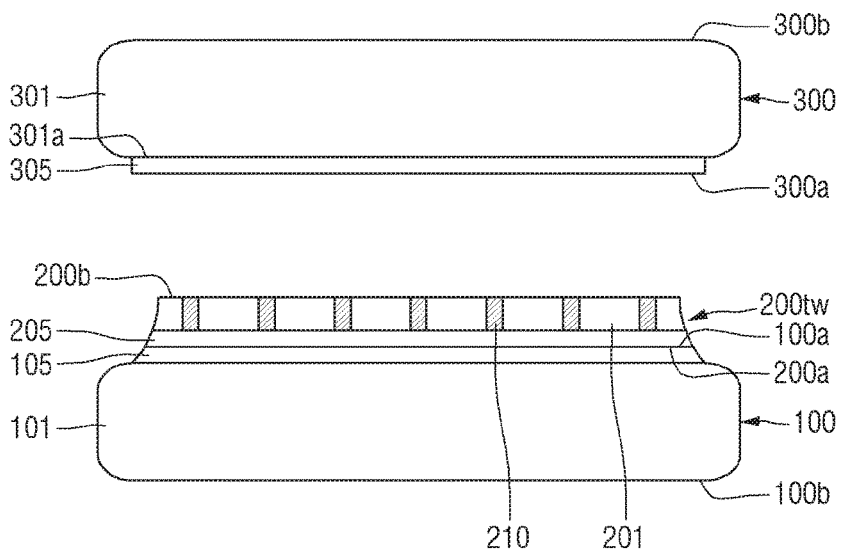
FIGS. 18 to 22B are views illustrating intermediate stages of fabrication, provided to explain a method for fabricating a substrate structure according to some example embodiments of inventive concepts.

Referring to FIG. 18, a third substrate 300 including a third device region 305 may be provided.

The third substrate 300 includes a first surface 300a and a second surface 300b opposite each other. The third substrate 300 includes a third base substrate 301 and the third device region 305 formed on the third base substrate 301.

The third device region 305 may be formed at the first surface 300a of the third substrate. That is, the first surface 300a of the third substrate may be defined by the third device region 305.

The third device region 305 may be formed on one surface 301a of the third base substrate. The other surface of the third base substrate 301 opposite the one surface 301a of the third base substrate may be the second surface 300b of the third substrate.

The third substrate 300 may include a plurality of die regions that may become logic chips or memory chips through a dicing process.

Like the first device region 105, the third device region 305 may include a circuit pattern and a wiring structure.

Next, the first trimmed substrate 200tw bonded to the first substrate 100 and the third substrate 300 are disposed so that the first surface 300a of the third substrate faces the second surface 200b of the first trimmed substrate 200tw.

In other words, the first trimmed substrate 200tw and the third substrate 300 are disposed so that the third device region 305 formed at the first surface 300a of the third substrate faces the second surface 200b of the first trimmed substrate 200tw.

Figure 19:
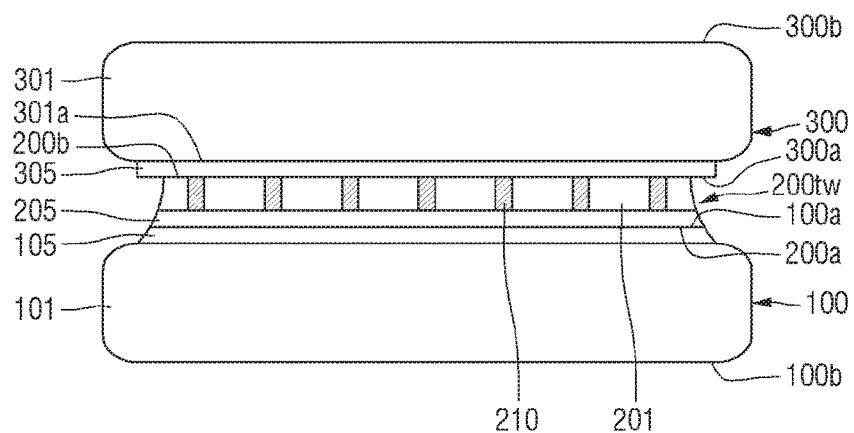

Referring to FIG. 19, the third substrate 300 is bonded to the first trimmed substrate 200tw.

More specifically, the second surface 200b of the first trimmed substrate 200tw and the first surface 300a of the third substrate that are disposed so as to face each other may be bonded so that the first trimmed substrate 200tw and the third substrate 300 may be bonded. The first surface 300a of the third substrate may be bonded to the second surface 200b of the first trimmed substrate 200tw.

Accordingly, the first substrate 100, the first trimmed substrate 200tw, and the third substrate 300 may be bonded to each other.

As illustrated in FIG. 19, the first trimmed substrate 200tw and the substrate 300 may be directly bonded to each other, although example embodiments are not limited thereto. That is, it is of course possible that the conductive connector and the encapsulating insulating film may be formed between the first trimmed substrate 200tw and the third substrate 300.

The device region 305 may be bonded to the second surface 200b of the first trimmed substrate 200tw as the first trimmed substrate 200tw and the third substrate 300 are bonded to each other. For example, the third device region 305 may be electrically connected to the first through electrode 210 in the first trimmed substrate 200tw.

The third device region 305 may be electrically connected to the second device region 205 via the first through electrode 210. Additionally, the third device region 305 may also be electrically connected to the first device region 105.

Figure 20:
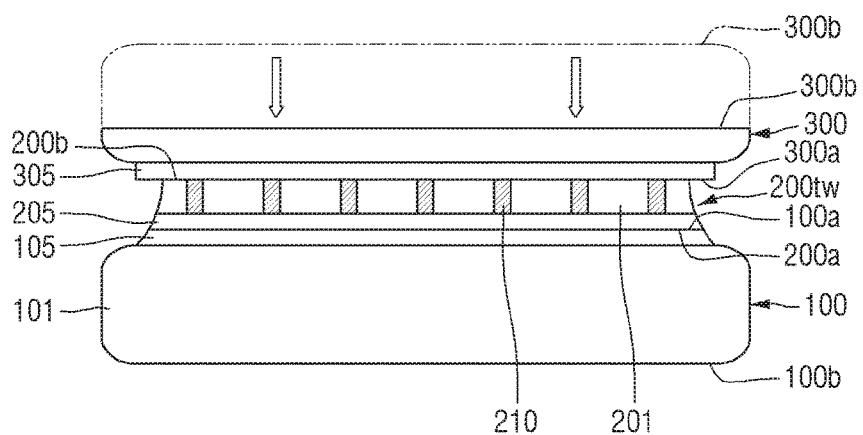

Referring to FIG. 20, a portion of the third substrate 300 bonded to the first trimmed substrate 200tw may be removed to reduce the thickness of the third substrate 300.

By removing a portion of the third base substrate 301, the thickness of the third substrate 300 may be reduced. The second surface 300b of the third substrate becomes closer to the third device region 305 as the thickness of the third substrate 300 is reduced.

The third substrate 300 having the reduced thickness includes an edge region 300er (FIG. 21) including a bevel region of the third substrate 300.

Figure 21:
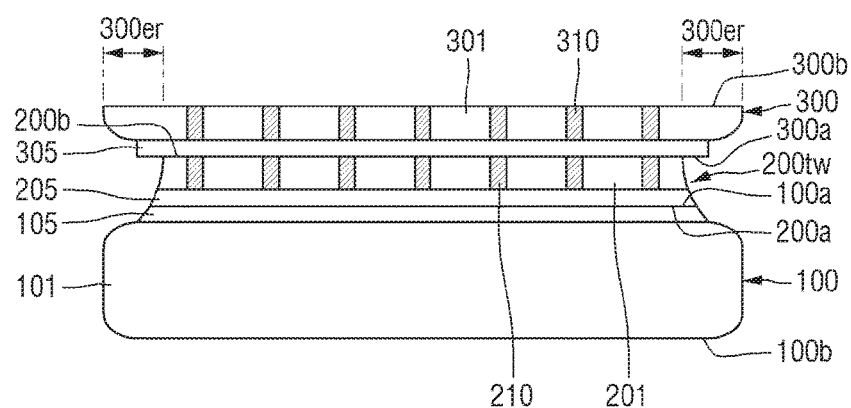

Referring to FIG. 21, a second through electrode 310 may be formed in the third substrate 300 such that it 310 is electrically connected to the third device region 305.

For example, the second through electrode 310 may extend from the second surface 300b of the third substrate to the third device region 305. After the via hole penetrating the third base substrate 301 is formed, the second through electrode 310 may be formed by filling the via hole with a conductive material.

The second through electrode 310 may be electrically connected to the first through electrode 210 through the third device region 305.

Figure 22A:
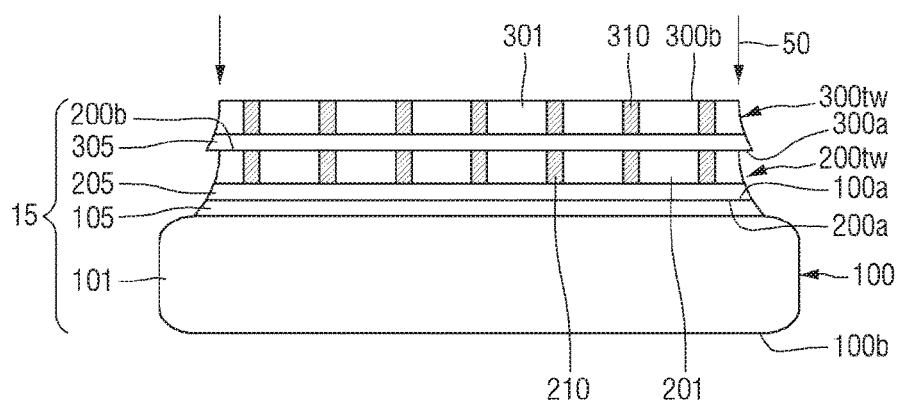
Figure 22B:
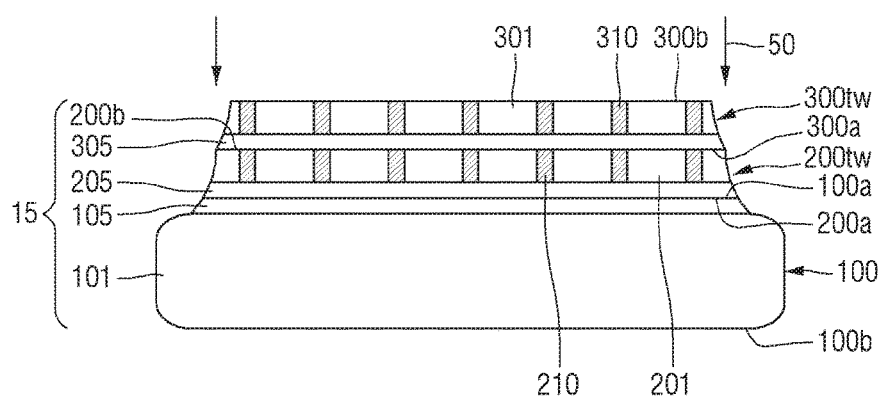

Referring to FIGS. 21 to 22B, a second trimmed substrate 300tw bonded to the first trimmed substrate 200tw is formed by etching the edge region 300er of the third substrate. As a result, the second substrate structure 15, to which the first substrate 100, the first trimmed substrate 200tw, and the second trimmed substrate 300tw are bonded, is formed.

The second trimmed substrate 300tw may be formed by removing the bevel region of the third substrate 300 having the reduced thickness.

The edge region 300er of the third substrate may be removed through a dry etch process. For example, the edge region 300er of the third substrate may be removed through the first etch process 50.

In a state where the second surface 300b of the third substrate is entirely exposed, the edge region 300er of the third substrate may be removed using the first etch process 50. As a result, the second trimmed substrate 300tw may be formed.

A sidewall of the second trimmed substrate 300tw may include an inclined surface having a slope that is an acute angle with respect to the first surface 100a of the first substrate when the edge region 300er of the third substrate is removed through the first etch process 50 which is a dry etch process.

The second substrate structure 15 will be described with reference to FIGS. 22A and 22B. Differences from the first substrate structure 10 that are not explained above with reference to FIGS. 8 and 9 will be mainly explained below.

The second trimmed substrate 300tw of the second substrate structure 15 includes the first surface 300a and the second surface 300b opposite each other, and the third device region 305 formed at the first surface 300a of the second trimmed substrate 300tw. The size of the second trimmed substrate 300tw is less than that of the first substrate 100.

The first surface 300a of the second trimmed substrate 300tw and the second surface 200b of the first trimmed substrate 200tw are bonded. Further, the third device region 305 may be electrically connected to the second device region 205.

Referring to FIG. 22A, the width of the second surface 200b of the first trimmed substrate 200tw is less than that of the first surface 300a of the second trimmed substrate 300tw. That is, a portion of the first surface 300a of the second trimmed substrate 300tw may protrude laterally farther than the second surface 200b of the first trimmed substrate 200tw.

In other words, the profile of the sidewall of the first trimmed substrate 200tw and the profile of the sidewall of the second trimmed substrate 300tw may be discontinuous at the boundary between the first trimmed substrate 200tw and the second trimmed substrate 300tw.

Referring to FIG. 22B, the width of the second surface 200b of the first trimmed substrate 200tw may be substantially the same as the first surface 300a of the second trimmed substrate 300tw.

In other words, the profile of the sidewall of the first trimmed substrate 200tw and the profile of the sidewall of the second trimmed substrate 300tw may be continuous at the boundary between the first trimmed substrate 200tw and the second trimmed substrate 300tw. That is, the sidewall of the first trimmed substrate 200tw and the sidewall of the second trimmed substrate 300tw may have a continuous profile.

Figure 23:
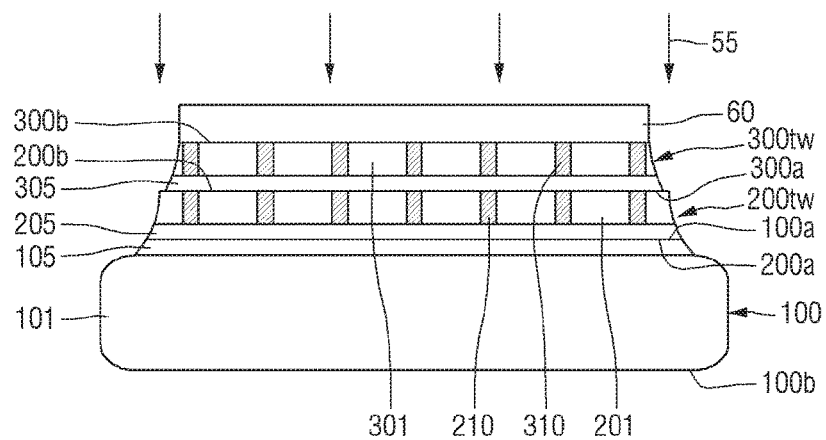
FIGS. 23 and 24 are views illustrating intermediate stages of fabrication, provided to explain a method for fabricating a substrate structure according to some example embodiments of inventive concepts.
Figure 24:
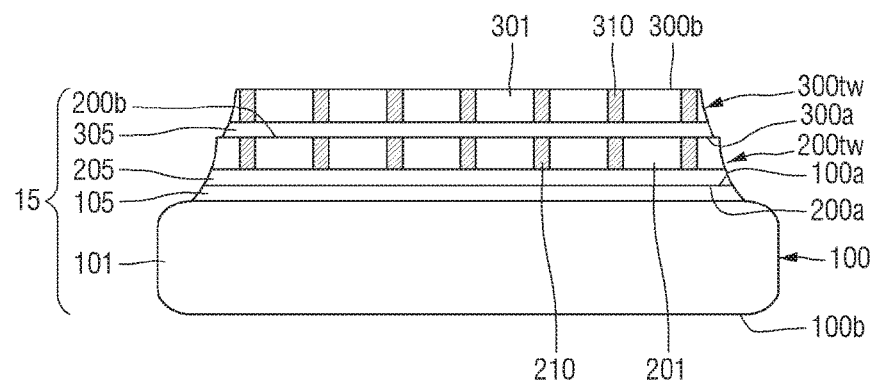

FIGS. 23 and 24 are views illustrating intermediate stages of fabrication, provided to explain a method for fabricating a substrate structure according to some example embodiments of inventive concepts. For convenience of explanation, differences that are not explained above with reference to FIGS. 18 to 22B will be mainly explained below.

For reference, FIG. 23 may involve a process performed after FIG. 21.

Referring to FIGS. 21 and 23, the mask pattern 60 may be formed on the third substrate 300. The mask pattern 60 may be formed on the second surface 300b of the third substrate.

The mask pattern 60 may expose the edge region 300er of the third substrate. That is, the mask pattern 60 is not formed on the second surface 300b of the third substrate included in the edge region 300er of the third substrate.

The mask pattern 60 may be formed in a central region of the third substrate 300 and may expose an edge portion including the bevel of the third substrate 300.

Next, the edge region 300er of the third substrate may be removed using the mask pattern 60.

The edge region 300er of the third substrate may be etched through the second etch process 55 to form the second trimmed substrate 300tw bonded to the first trimmed substrate 200tw.

Referring to FIG. 24, by removing the mask pattern 60, the second substrate structure 15, to which the first substrate 100, the first trimmed substrate 200tw and the second trimmed substrate 300tw are bonded, is formed.

The width of the second surface 200b of the first trimmed substrate 200tw is greater than that of the first surface 300a of the second trimmed substrate 300tw. A portion of the first trimmed substrate 200tw may protrude laterally farther than the second surface 200b of the second trimmed substrate 300tw. That is, a portion of the second surface 200b of the first trimmed substrate 200tw is not covered by the first surface 300a of the second trimmed substrate 300tw.

In other words, the profile of the sidewall of the first trimmed substrate 200tw and the profile of the sidewall of the second trimmed substrate 300tw may be discontinuous at the boundary between the first trimmed substrate 200tw and the second trimmed substrate 300tw.

FIGS. 25 to 28 are views illustrating intermediate stages of fabrication, provided to explain a method for fabricating a substrate structure according to some example embodiments of inventive concepts. For reference, FIG. 25 may involve a process performed after FIG. 8.

Figure 25:
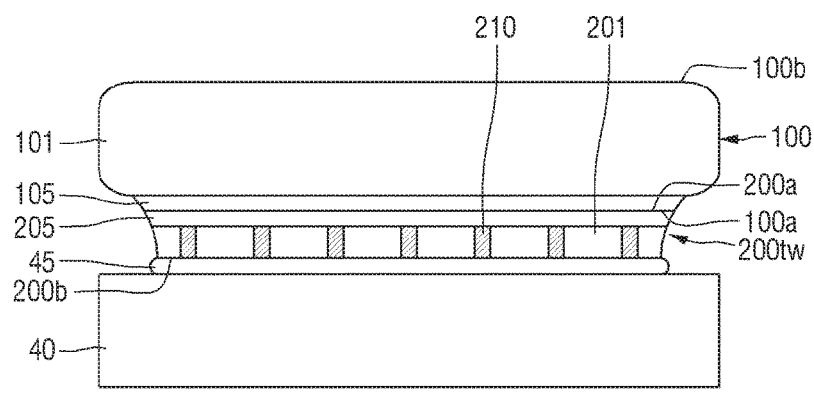
FIGS. 25 to 28 are views illustrating intermediate stages of fabrication, provided to explain a method for fabricating a substrate structure according to some example embodiments of inventive concepts.

Referring to FIG. 25, the first trimmed substrate 200tw and the carrier 40 may be bonded using the adhesive film 45.

The adhesive film 45 may be disposed between the carrier 40 and the second surface 200b of the first trimmed substrate 200tw. The adhesive film 45 may serve to fix the carrier 40, and the first substrate 100 and the first trimmed substrate 200tw.

Figure 26:
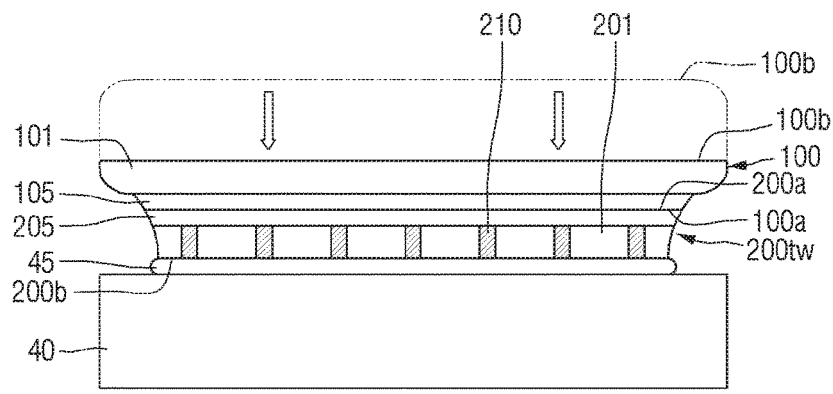

Referring to FIG. 26, a portion of the first substrate 100 bonded to the carrier 40 may be removed to reduce the thickness of the first substrate 100.

By removing a portion of the first base substrate 101, the thickness of the first substrate 100 may be reduced. The second surface 100b of the first substrate becomes closer to the first device region 105 as a thickness of the first substrate 100 is reduced.

The first substrate 100 having the reduced thickness includes an edge region including a bevel region of the second substrate 200.

Figure 27:
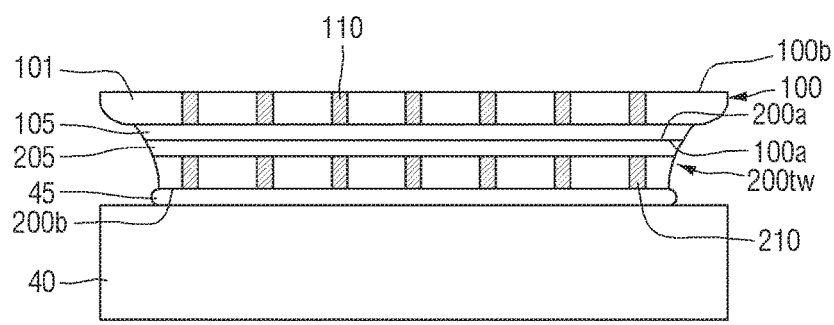

Referring to FIG. 27, a third through electrode 110 may be formed in the first substrate 100 such that it is electrically connected to the first device region 105.

For example, the third through electrode 110 may extend from the second surface 100b of the first substrate to the first device region 105. The third through electrode 110 may be electrically connected to the second device region 205 through the first device region 105.

Figure 28:
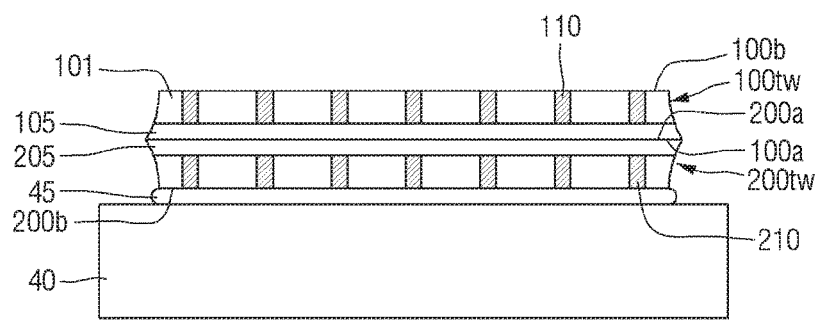

Referring to FIG. 28, the third trimmed substrate 100tw bonded to the first trimmed substrate 200tw is formed by etching the edge region of the first substrate 100.

The third trimmed substrate 100tw may be formed by removing the bevel region of the first substrate 100 having the reduced thickness.

The edge region of the first substrate 100 may be removed through a dry etch process.

By removing the carrier 40, a substrate structure may be formed.

Unlike illustrated in FIGS. 25 to 28, the first substrate 100 before bonding with the carrier 40 may include the third through electrode 110. In such a case, in FIG. 26, the thickness of the first substrate 100 may be reduced until the third through electrode 110 is exposed. At this time, FIG. 27 which forms the third through electrode 110 is omitted.

Figure 29:
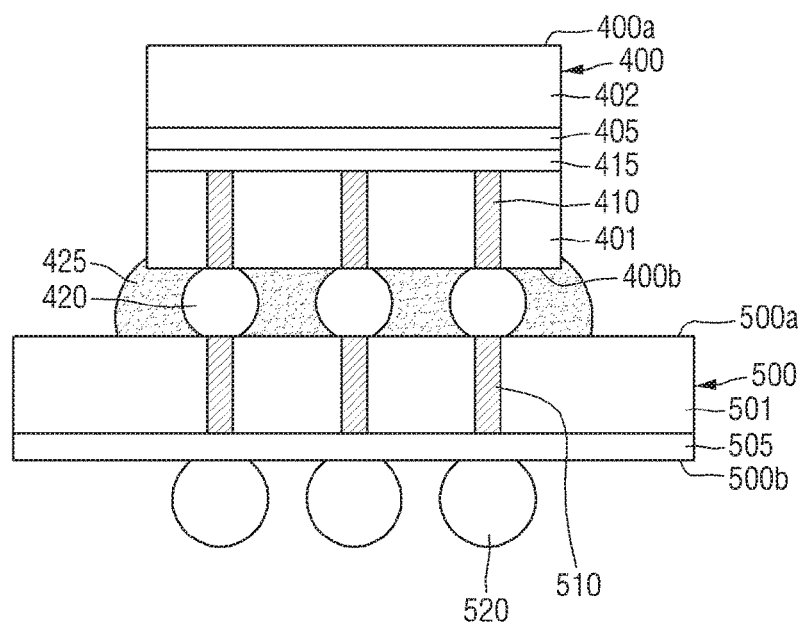
FIG. 29 is an example view provided to explain a semiconductor package fabricated using another substrate structure fabricating method according to some example embodiments of inventive concepts.

FIG. 29 is an example view provided to explain a semiconductor package fabricated using another substrate structure fabricating method according to some example embodiments of inventive concepts.

Referring to FIG. 29, a semiconductor package according to some example embodiments includes a first semiconductor chip 400 and a second semiconductor chip 500.

The first semiconductor chip 400 may include a first surface 400a and a second surface 400b opposite each other. The first semiconductor chip 400 may include a fourth upper device region 405 and a fourth lower device region 415 bonded directly to each other.

The first semiconductor chip 400 includes a fourth upper base substrate 402 adjacent to the fourth upper device region 405, and a fourth upper base substrate 401 adjacent to the fourth lower device region 415. The first surface 400a of the first semiconductor chip may be defined by the fourth upper base substrate 402, and the second surface 400b of the first semiconductor chip may be defined by the fourth lower base substrate 401.

The first semiconductor chip 400 may include a fourth through electrode 410. For example, the fourth through electrode 410 may be formed within the fourth lower base substrate 401, although example embodiments are not limited thereto. That is, the fourth through electrode 410 may be formed within a fourth upper base substrate 402. The fourth through electrode 410 may be electrically connected to the fourth upper device region 405 and the fourth lower device region 415.

In FIG. 29, the first semiconductor chip 400 is shown as being similar to the first substrate structure 10 of FIG. 8 diced in chip units, although example embodiments are not limited thereto. That is, the first semiconductor chip 400 may be the one that is obtained as a result of dicing the substrate structure formed through the method fabricating the substrate structure described with reference to FIGS. 1 to 15 and 18 to 28.

The second semiconductor chip 500 may include a first surface 500a and a second surface 500b opposite each other. Further, the second semiconductor chip 500 may include a fifth device region 505.

The second semiconductor chip 500 may include a fifth through electrode 510 formed within a fifth base substrate 501.

The first surface 500a of the second semiconductor chip may face the second surface 400b of the first semiconductor chip.

A first connection terminal 420 is disposed between the first semiconductor chip 400 and the second semiconductor chip 500. The first connection terminal 420 is located between the first surface 500a of the second semiconductor chip and the second surface 400b of the first semiconductor chip.

The first connection terminal 420 electrically connects the first semiconductor chip 400 to the second semiconductor chip 500.

A fixing film 425 is formed between the first surface 500a of the second semiconductor chip and the second surface 400b of the first semiconductor chip. The fixing film 425 may cover a portion of the sidewall of the first semiconductor chip 400, but not limited thereto.

A second connection terminal 520 is formed on the second surface 500b of the second semiconductor chip. The second connection terminal 520 is electrically connected to the fifth device region 505.

It should be understood that example embodiments described herein should be considered in a descriptive sense only and not for purposes of limitation. Descriptions of features or aspects within each device or method according to example embodiments should typically be considered as available for other similar features or aspects in other devices or methods according to example embodiments. While some example embodiments have been particularly shown and described, it will be understood by one of ordinary skill in the art that variations in form and detail may be made therein without departing from the spirit and scope of the claims.

What is claimed is:

1. A method for fabricating a substrate structure comprising:
    providing a first substrate including first and second surfaces opposite each other, and a first device region at the first surface;
    providing a second substrate including third and fourth surfaces opposite each other, and a second device region at the third surface;
    bonding the first substrate and the second substrate to electrically connect the first device region and the second device region; and
    forming a trimmed substrate, the forming the trimmed substrate including etching an edge region of the second substrate bonded to the first substrate,
    wherein a sidewall of the second substrate includes an inclined surface that is acute with respect to the first surface of the first substrate, and
    the sidewall of the second substrate includes a continuous profile with a sidewall of the first device region.

2. The method of claim 1, wherein the forming a trimmed substrate includes:
    forming a mask pattern on the fourth surface of the second substrate for exposing the edge region of the second substrate; and
    removing the edge region of the second substrate using the mask pattern as an etching mask.

3. The method of claim 1, wherein the forming a trimmed substrate includes removing the edge region of the second substrate while the fourth surface of the second substrate is entirely exposed.

4. The method of claim 1, wherein the forming a trimmed substrate includes removing the edge region of the second substrate using a dry etching process.

5. The method of claim 1, further comprising:
    forming a through electrode in the second substrate after the bonding the first substrate and the second substrate to electrically connect the first device region and the second device region, wherein the through electrode is electrically connected to the second device region.

6. The method of claim 1, wherein the bonding the first substrate and the second substrate includes directly bonding the first substrate and the second substrate.

7. The method of claim 6, wherein the directly bonding the first substrate to the second substrate includes:
    arranging the first surface of the first substrate to face the third surface of the second substrate; and
    bonding the first device region and the second device region.

8. The method of claim 6, wherein the directly bonding the first substrate and the second substrate includes:
    disposing the first substrate and the second substrate such that the second surface of the first substrate and the third surface of the second substrate face each other; and
    bonding the second device region to the second surface of the first substrate.

9. The method of claim 1, wherein the bonding the first substrate and the second substrate includes forming a conductive connector on the third surface of the second substrate and electrically connecting the first device region and the second device region to each other using the conductive connector.

10. The method of claim 9, wherein the bonding the first substrate and the second substrate includes forming an encapsulating insulating film surrounding a periphery of the conductive connector between the first surface of the first substrate and the third surface of the second substrate.

11. The method of claim 1, further comprising
    before forming the trimmed substrate, removing a portion of the second substrate bonded to the first substrate to reduce a thickness of the second substrate.

12. The method of claim 11, wherein
    the second substrate includes a through electrode, and
    the through electrode is exposed during the removing the portion of the second substrate.

13. A method for fabricating a substrate structure comprising:
    providing a first substrate including first and second surfaces opposite each other, and a first device region at the first surface;
    bonding the first surface of the first substrate to a carrier;
    removing a portion of the first substrate bonded to the carrier to reduce a thickness of the first substrate; and
    removing an edge region of the first substrate using a dry etching process after the second surface of the first substrate having the reduced thickness is entirely exposed.

14. The method of claim 13, further comprising:
    forming a through electrode in the first substrate before the removing the edge region of the first substrate.

15. The method of claim 13, wherein
    the carrier is a second substrate including a second device region, and
    the bonding the first surface of the first substrate to the carrier includes disposing the first substrate and the second substrate such that the first device region and the second device region face each other, and
    electrically connecting the first device region and the second device region.

16. A method for fabricating a substrate structure comprising:
    forming a preliminary substrate structure, the preliminary substrate structure including a first device region of a first substrate bonded to a second device region of a second substrate such that a first surface of the second device region is on top of a first surface of the first device region, the first substrate including the first device region on one surface of a first base substrate; and forming a trimmed substrate, the forming a trimmed substrate including etching an edge region of the preliminary substrate structure such that a sidewall of the first device region and a sidewall of the second device region define an inclined surface with respect to the one surface of the first base substrate, the edge region of the preliminary substrate structure including an edge region of the first device region and an edge region of the second device region.

17. The method of claim 16, wherein the forming a preliminary substrate structure includes directly bonding the first substrate to the second substrate.

18. The method of claim 16, wherein the forming a preliminary substrate structure includes electrically connecting the first device region to the second device region.

19. The method of claim 16, wherein the etching is performed while a protection ring covers a center region of the preliminary substrate structure and exposes the edge region.

20. The method of claim 16, wherein
the second substrate includes a second base substrate,
the second device region is on one surface of the second base substrate,
the forming a preliminary substrate structure includes reducing a thickness of the second substrate, and
a width of the second base substrate is greater than a width of the second device region.

* * * * *